United States Patent [19]

Ladany

[11] 4,049,994

[45] Sept. 20, 1977

[54] LIGHT EMITTING DIODE HAVING A SHORT TRANSIENT RESPONSE TIME

[75] Inventor: Ivan Ladany, Stockton, N.J.

[73] Assignee: RCA Corporation, New York, N.Y.

[21] Appl. No.: 652,224

[22] Filed: Jan. 26, 1976

[51] Int. Cl.² ............................................ H05B 33/16
[52] U.S. Cl. ...................................... 313/499; 357/17
[58] Field of Search .......................... 313/499; 357/17

[56] References Cited

U.S. PATENT DOCUMENTS

| | | | |
|---|---|---|---|
| 3,419,742 | 12/1968 | Herzog ................................ | 313/499 |
| 3,537,029 | 10/1970 | Kressel et al. ..................... | 313/499 X |
| 3,636,416 | 1/1972 | Umeda ............................. | 313/499 X |
| 3,920,491 | 11/1975 | Yonezu ............................. | 313/499 X |

Primary Examiner—Palmer C. Demeo

Attorney, Agent, or Firm—Glenn H. Bruestle; Daniel N. Calder

[57] ABSTRACT

A body of semiconductor material of an electroluminescent device is on a gallium arsenide substrate of N type conductivity. The body includes a first region of N type conductivity aluminum gallium arsenide contiguous to a surface of the substrate and a second region of silicon doped P type gallium arsenide on the first region and spaced from the substrate. The P-N junction between the first and second regions is a heterojunction, and is the only heterojunction with the second region. The second region is of a thickness, extending from the P-N junction, in the range of 50 to 200 micrometers. The electroluminescent device is capable of transient response time of 0.2 microseconds or less.

10 Claims, 2 Drawing Figures

LIGHT EMITTING DIODE HAVING A SHORT TRANSIENT RESPONSE TIME

BACKGROUND OF THE INVENTION

The present invention relates to electroluminescent devices and particularly electroluminescent devices having a short transient response time.

Electroluminescent devices and specifically light emitting diodes (LED) generate incoherent optical radiation through the recombination of pairs of oppositely charged carriers. In a field, such as optical communications, where light emitting diodes are coupled into light transmission pipes, the transient response time, also known as the rise time, of the LED with respect to the LED's modulated input signal becomes very critical. The transient response time of an LED is the time it takes for the optical radiation output to reach about 90% of its maximum output after the application of a step input current. Ideally the transient response time for an LED used for optical communications should be short, i.e. on the order of a few tenths of a microsecond or less.

In the prior art a typical LED had a P type conductivity region of GaAs contiguous to an N type conductivity region of GaAs with both regions being doped by the amphoteric conductivity modifier silicon. This typical LED of the prior art is described in the article entitled "Electroluminescence Characteristics and Efficiency of GaAs:Si Diodes" by I. Ladany, J. Appl. Phys. Vol. 42, No. 2, February, 1971, pages 654 to 656. While this typical prior art LED had an efficiency of 32%, its transient response time, of approximately 1.5 to 2.0 microseconds for a pulse current input, is not ideally suited for applications requiring a short response time. Generally, achieving a short response time was at the cost of efficiency, i.e. the shorter the response time the less efficiency in converting current to optical radiation. Therefore, it would be most desirable, especially in the optical communications field, to have a high efficiency LED with a short transient response time.

SUMMARY OF THE INVENTION

An electroluminescent device, capable of a transient response time of 0.2 microseconds or less, includes a body of semiconductor material. The body has a first region of aluminum gallium arsenide of N type conductivity contiguous to a second region of gallium arsenide of P type conductivity. The second region has only silicon as the conductivity modifier. The second region has a heterojunction only with the first region. The second region has a thickness, extending from the heterojunction, in the range of about 50 to 200 micrometers.

DETAILED DESCRIPTION OF THE DRAWINGS

Figure 1:
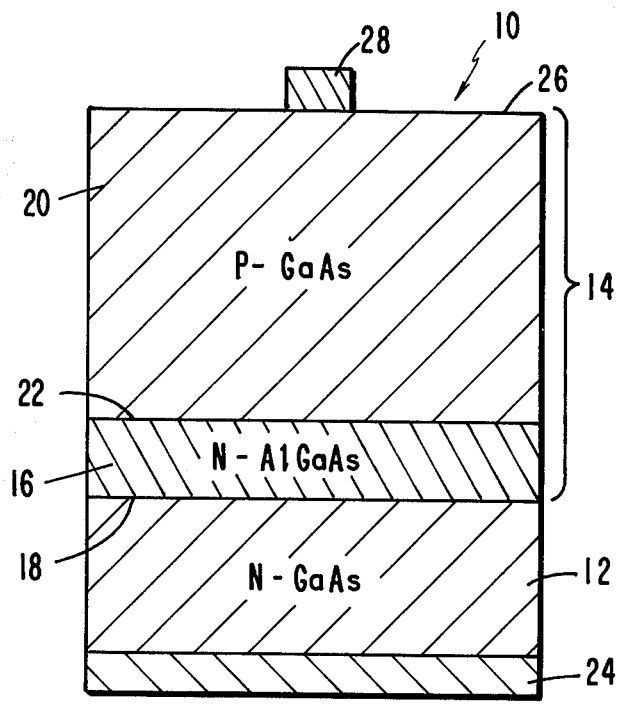
FIG. 1 is a cross-sectional view of the semiconductor electroluminescent device of the present invention.

Referring initially to FIG. 1, the electroluminescent semiconductor device of the present invention having an improved transient response time is generally designated as 10. The semiconductor electroluminescent device 10 is preferably a light emitting diode (LED). The semiconductor electroluminescent device 10 includes a substrate 12 of N type conductivity gallium arsenide with a semiconductor body 14, capable of electroluminescence, contiguous to a surface of the substrate 12.

The body 14 includes a first region 16 of N type conductivity on the substrate 12 forming an N—N junction 18 therebetween. A second region 20 of P type conductivity is on the first region 16 with a P-N junction 22 therebetween. The second region 20 is of a thickness, extending from the P-N junction 22, in the range of 50 to 200 micrometers. While the thickness of the first region 16 and substrate 12 are not critical, typically the first region 16 is on the order of about 6 micrometers and the substrate 12 is on the order of about 100 micrometers.

The first region 16 is of aluminum gallium arsenide with typically 10 mole % aluminum, and is doped by an N type conductivity modifier such as tellurium, tin or sulphur. Generally, the substrate 12 functions as a contact to the first region 16, since as is well known in the art it is easier to make electrical contact to gallium arsenide than to gallium aluminum arsenide. The second region 20 is of gallium arsenide, which has only silicon as the P type conductivity modifier. The P-N junction 22 is a heterojunction since the first region 16 and second region 20 are of different semiconductor compositions. Also, the P-N heterojunction 22 is an abrupt junction, that is the N type conductivity carriers of the first region 16 and P type conductivity carriers of the second region 20 abruptly terminate at the P-N junction 22.

On a surface of the substrate 12 opposite the first region 16 is a first metallic contact 24. A surface of the second region 20 opposite the P-N junction 22 is designated as the surface 26. From the surface 26 and the side surfaces of the body 14 and substrate 12 which are exposed, most of the light generated within the electroluminescent device 10, is emitted. On the surface 26 is a second metallic contact 28 which is typically circular in shape, and only in intimate contact with a small area of the surface 26, i.e about 10% or less of the surface 26. Typically, the first metallic electrode 24 is of a sintered gold-tin alloy with the second metallic contact 28 of a sintered gold-zinc alloy. While the second metallic contact 28 is described as being circular in shape, it may be of any other configuration well known to those in the art, e.g. metallic fingers, as long as the area of the surface 26 contacted by the second metallic contact 28 is small. Also, the first metallic contact 24 may be of other configurations not described but well known in the art and which will reflect light generated in the device 10 toward the surface 26.

In the typical operation of the electroluminescent device 10 a forward bias voltage is applied to the device 10 by connecting the first metallic contact 24 to a negative electrode of a direct current (D.C.) source and connecting the second metallic contact 28 to a positive electrode of the direct current source. Upon the application of the forward bias voltage to the P-N heterojunction 22, electron carriers in the first region 16 are injected into the second region 20. Hole carriers in the second region 20 are generally not injected into the first region 16 since the potential barrier at the P-N heterojunction 22 is higher for hole carriers than for electron carriers. This difference in the potential barriers for hole and electron carriers is a result of the bandgap energy difference of the semiconductor materials at the P-N junction 22. The injected electron carriers in the second region 20 undergo radiative recombination with the result that optical radiation is generated in the second region 20. Second region 20 is the active region of the electroluminescent device 10.

Figure 2:
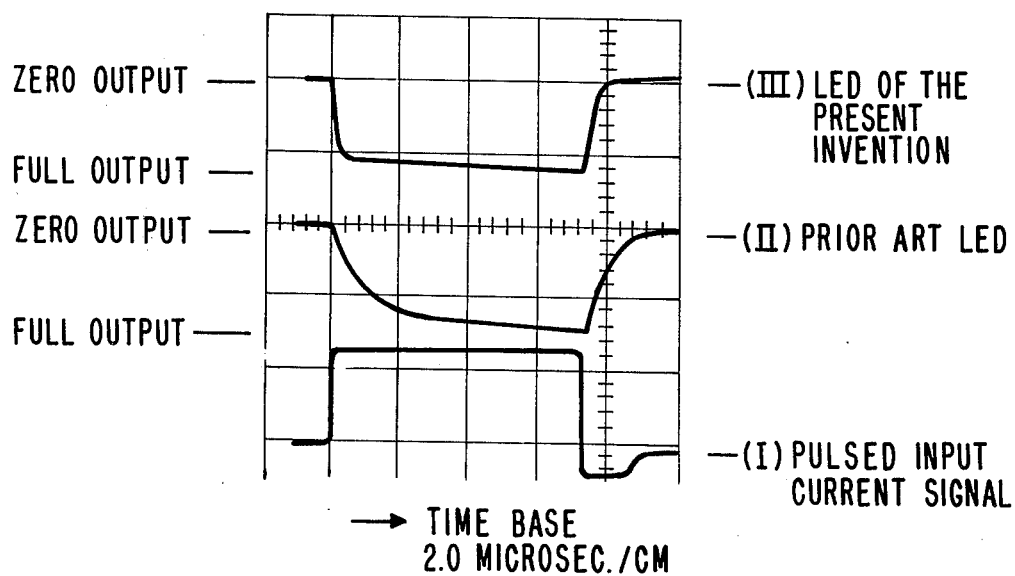
FIG. 2 is an oscilloscope trace of a pulsed input signal and the corresponding optical radiation output signal of the electroluminescent device of the present invention and a prior art light emitting diode.

Superimposed with the D. C. biasing signal is an A. C. signal which may be either amplitude, frequency or pulse modulated. This A. C. signal modulates the optical radiation output of the LED 10, and it is the transient response time of the LED 10 with respect to to the A. C. Signal which is short. Referring to FIG. 2, there, is shown a pulsed input current signal (I), the corresponding time response of the optical radiation output of a prior art LED (II), as described in the Ladany article, and the corresponding time response of the optical radiation output of the LED 10 (III) of the present invention. For the purpose of describing the short response time of the LED 10, the pulsed input current signal (I) is without a D. C. bias. With the oscilloscope trace of FIG. 2 at a time base of 2.0 microseconds/cm and a pulsed input signal of approximately 50 milliamps, one can see that it takes less time for the LED 10 (III) to reach its full and zero outputs as compared to the prior art LED (II), i.e. the transient response time of the LED 10 (III) is much faster than that of the prior art LED (II). Typically, the LED 10 of the present invention will have a transient response time for a pulsed current input on the order of 0.2 microseconds or less.

It is not known with exact certainty why the LED 10 has a short transient response time, but it is believed that with the P-N junction 22 being a heterojunction, which has a more efficient injection mechanism than a homojunction, there is a much faster spreading of carriers throughout the P type second region 20, thus allowing the faster recombination process in the silicon doped second region 20 to determine the response time.

It is known that silicon doped gallium arsenide LED's are very efficient because the wavelength of the emitted optical radiation is longer than that of the corresponding bandgap energy of gallium arsenide. Consequently, there is less internal optical radiation absorption in a P-type region of a gallium arsenide LED doped with silicon, i.e. second region 20, than one doped with zinc or tellurium. Furthermore, it is also known that light is generated throughout the thickness of the P type second region 20 of LED 10 and thus the thicker this region the more light that will be generated. These two known properties of the LED 10 may account for the fact that the LED 10 has an overall efficiency approximately equivalent to that of the prior art gallium arsenide, silicon doped LED reported in the Ladany article.

The LED 10 may be fabricated by epitaxially depositing on an N type gallium arsenide wafer, which is thinner than the substrate 12 but which will form a portion of the substrate 12, N type gallium arsenide material to the desired thickness of the substrate 12, then the first region 16 and finally the second region 20 on the first region 16. It has been found that the gallium aluminum arsenide of the first region 16 has better crystalline qualities if grown on newly fabricated N type gallium arsenide, thus the reason for fabricating a portion of the substrate 12 just prior to forming the first region 16. The newly grown portion of the substrate 12 and the first and second regions 16 and 20 are preferably deposited by liquid phase epitaxy. They may be deposited by using the method and apparatus described in the U.S. Pat. No. 3,897,281 issued July 29, 1975 to S. L. Gilbert et al, entitled "Method For Epitaxially Growing A Semiconductor Material On A Substrate."

In the method described in U.S. Pat. No. 3,897,281 charges of the semiconductor material and conductivity modifiers to be deposited are placed in the wells of a refractory furnace boat. The first well, from which is deposited a portion of the substrate 12, contains 3 grams of gallium, 120 milligrams of gallium arsenide and 300 milligrams of tin dopant. The second well, from which the first region 16 is deposited, contains 3 grams of gallium, 90 milligrams of gallium arsenide, 300 milligrams of tin and 0.8 milligrams of aluminum. The third well, from which the second region 20 is deposited, contains 3 grams of gallium, 120 milligrams of gallium arsenide and 7.5 milligrams of silicon. An N type gallium arsenide wafer is placed in a slide which extends longitudinally through the boat and across the bottom of the wells. The boat and its contents are heated to 840° C. at which the charges become molten. After reaching 840° C. the slide is moved into the first well and the furnace contents are cooled to about 830° C. During the cooling of the molten charge the semiconductor material is deposited on the wafer as a part of the substrate 12. The wafer is moved into the second well and the furnace contents are cooled to 820° C. for the deposition of the first region 16. Then the wafer is moved into the third well and the furnace contents are cooled to 500° C. for the deposition of the second region 20. Below 830° C. silicon becomes a P type dopant. The wafer is then removed from the furnace and by state of the art evaporation and masking techniques the first and second metallic contacts 24 and 28 are formed on the substrate 12 and second region 20 respectively.

The light emitting diode 10 of the present invention has a high efficiency and has an optical radiation output with a short transient response time.

I claim:

1. An electroluminescent device, capable of a transient response time of .2 microseconds or less, comprising:

a body of semiconductor material having a first region of aluminum gallium arsenide of N type conductivity contiguous to a second region of gallium arsenide of P type conductivity, said second region having only silicon as the conductivity modifier, said second region having a heterojunction only with said first region, and said second region being of a thickness, extending from said heterojunction, in the range of about 50 to 200 micrometers;

a substrate in contact with a surface of said first region opposite said heterojunction; and means for electrically contacting said body and said substrate.

2. The electroluminescent device in accordance with claim 1 wherein said substrate is gallium arsenide of N type conductivity.

3. The electroluminescent device in accordance with claim 2 wherein said first region has approximately 10 mole % aluminum.

4. The electroluminescent device in accordance with claim 3 wherein said heterojunction is an abrupt junction with respect to the conductivity carriers of said first and second regions.

5. The electroluminescent device in accordance with claim 4 wherein the N type conductivity modifier of said first region is tellurium.

6. The electroluminescent device in accordance with claim 4 wherein the N type conductivity modifier of said first region is tin.

7. The electroluminescent device in accordance with claim 4 wherein the N type conductivity modifier of said first region is sulphur.

8. The electroluminescent device in accordance with claim 4 wherein said electrical contacting means comprises a first metallic contact on a surface of said substrate opposite said heterojunction, and a second metallic contact on a surface of said second region opposite said first metallic contact, said second metallic contact being in intimate contact with less than about 10% of the area of the surface.

9. The electroluminescent device in accordance with claim 8 wherein said first metallic contact is of a sintered gold-tin alloy and said second metallic contact is of a sintered gold-zinc alloy.

10. The electroluminescent device in accordance with claim 9 wherein said second metallic contact is circular in shape.

* * * * *